(12) United States Patent
Kim et al.

(10) Patent No.: US 6,582,523 B2
(45) Date of Patent: Jun. 24, 2003

(54) ORGANIC SOURCE BOAT STRUCTURE FOR ORGANIC ELECTRO-LUMINESCENT DISPLAY FABRICATING APPARATUS

(75) Inventors: Sun Woong Kim, Seoul (KR); Woo Young Kim, Seoul (KR); Sung Hoo Ju, Kyoungki-do (KR); Joo Hyeon Lee, Kyoungki-do (KR)

(73) Assignee: Hyundai Display Technology, Inc., Kyoungki-do (KR)

( * ) Notice: Subject to any disclaimer, the term of this patent is extended or adjusted under 35 U.S.C. 154(b) by 21 days.

(21) Appl. No.: 10/034,225

(22) Filed: Dec. 28, 2001

(65) Prior Publication Data

US 2002/0084958 A1 Jul. 4, 2002

(30) Foreign Application Priority Data

Dec. 30, 2000 (KR) .......................................... 2000-87248

(51) Int. Cl.[7] .............................................. C23C 14/00
(52) U.S. Cl. ...................................... 118/726; 392/389
(58) Field of Search ........................... 118/726; 392/389

(56) References Cited

U.S. PATENT DOCUMENTS

| | | | | |
|---|---|---|---|---|
| 3,244,557 A | * | 4/1966 | Chiou | 148/98 |
| 3,575,133 A | * | 4/1971 | Van Audenhove et al. | 118/727 |
| 4,328,763 A | * | 5/1982 | Sommerkamp et al. | 118/727 |
| 4,668,480 A | * | 5/1987 | Fujiyashu et al. | 118/719 |
| 5,265,189 A | * | 11/1993 | Schoenherr | 392/389 |
| 5,788,769 A | * | 8/1998 | Achtner et al. | 118/50 |
| 6,513,451 B2 | * | 2/2003 | Van Slyke et al. | 118/723 VE |

* cited by examiner

Primary Examiner—Richard Bueker
(74) Attorney, Agent, or Firm—Ladas & Parry

(57) ABSTRACT

An organic source boat structure for organic electro-luminescent display fabricating apparatus is provided to form an organic layer having uniform thickness. The organic source boat structure comprises: a plurality of host cells having a plurality of evaporation holes for evaporation of host organic source; a plurality of dopant cells alternatively arranged to the plurality of host cells, having a plurality of evaporation holes for evaporation of dopant organic source; a contamination control plate arranged between the host cells and the dopant cells; and a side cover to stably support the host cells and the dopant cells.

6 Claims, 7 Drawing Sheets

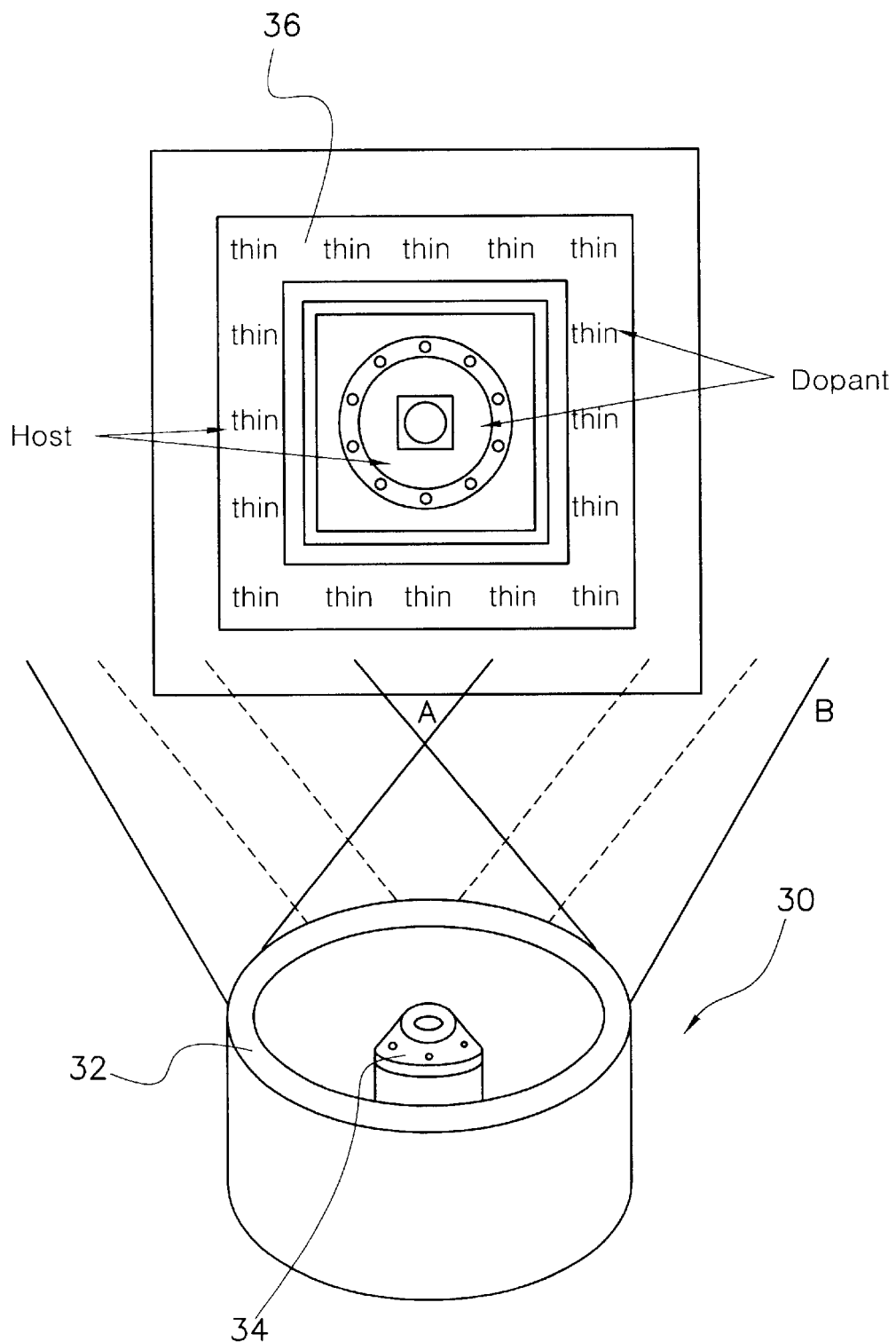

ORGANIC SOURCE BOAT STRUCTURE FOR ORGANIC ELECTRO-LUMINESCENT DISPLAY FABRICATING APPARATUS

BACKGROUND OF THE INVENTION

1. Field of the Invention

The present invention relates generally to an organic source boat structure for organic electro-luminescent display fabricating apparatus and, more particularly, to an organic source boat structure for organic electro-luminescent display fabricating apparatus having a structure for uniform deposition of organic source.

2. Description of the Related Art

As a self luminescent display having a wide view angle, an organic electro-luminescent display has been fabricated in a small and medium size to a large size and it is generally known as a next generation display capable of applying to wide areas including military use, office use and PDA.

The organic ELD has a multi-layered organic source layer structure between an anode ITO electrode layer and a cathode metal electrode layer formed on a glass substrate, wherein the organic source layer structure comprises a hole injection layer for injection of holes, an electron injection layer for injection of electrons and an organic luminescent layer interposed between the hole injection layer and the electron injection layer, emitting light by combination of the hole and the electron.

Generally, a device for fabrication of the organic EL device employs an organic source boat for evaporation of the organic source. The organic source boat is fabricated in a shape of crucible with ceramic or other materials having a low heat conductivity and a large heat capacity for prevention of sudden temperature rise and for stable heating.

FIGS. 1A and 1B show an organic source boat applied when one organic layer is formed by one organic source. Referring to FIG. 1A, a heating coil 12 is rolled around an organic source boat 10 in order to evaporate organic source. Referring to FIG. 1B, an organic source boat 14 is in a shape of plane plate and organic source is provided on a heating panel 16.

Therefore, the organic source boats 10,14 of FIGS. 1A and 1B are desirably applied in forming a single-layered organic source layer without doping when a small-sized panel is fabricated. In this case, it is possible to form an organic layer by one organic source boat 10, 14 while maintaining uniformity.

However, according to organic source boats 10,14 of FIGS. 1A and 1B, it is difficult to maintain uniformity of organic layer formation when they are applied to a large-sized panel, due to distance difference from organic source.

And, when an organic source layer is formed by a doping method using 2 or more organic sources, a simultaneous deposition method is employed. According to the method, a plurality of organic source boats are simultaneously heated, thereby simultaneously forming organic layers, as shown in FIG. 1C.

Referring to FIG. 1C, a first organic source boat 20a for evaporation of host organic source and a second organic source boat 20b for evaporation of dopant organic source are provided, thereby simultaneously depositing host organic source and dopant organic source.

Here, when the host organic source and the dopant organic source are simultaneously deposited by the organic source structure of FIG. 1C, a distance difference of organic source boats 20a and 20b is generated to the center of substrate and the outside, thereby lowering uniformity of mixing ratio between host organic source and dopant organic source deposited on the substrate.

That is, host organic source and dopant organic source are thickly formed in the long distance from corresponding organic source boats 20a and 20b and thinly formed in the short distance. Therefore, a difference is generated in doping concentration of dopant according to the position on the substrate, thereby respectively generating a low concentration region and a high concentration region.

Here, a dopant of organic EL device performs an essential part of luminescence, wherein chroma and efficiency of luminescence are determined by concentration of dopant and thickness of organic source layer. Therefore, brightness and chroma of luminescence and electrical properties of device are deteriorated by a concentration difference in luminescence layer of doped organic molecules. As a result, it is difficult to successfully form thickness and dopant distribution of organic source layer as a determinant of device properties in organic EL device having multi-layered organic source layer with organic source deposition structures shown in FIGS. 1A to 1C.

FIG. 2 shows an organic source boat structure having improved loading capacity of organic source and doping efficiency of dopant according to another conventional method.

The organic source boat 30 has a united structure comprising a first evaporation unit 32 for deposition of host organic source and a second evaporation unit 34 for deposition of dopant organic source, wherein the first evaporation unit 32 is disposed on the circularly-separated external side, having the same axis with the second evaporation unit 34 and the second evaporation unit 34 is disposed on the internal side thereof (that is, on the center of corresponding organic source boat 30).

According to FIG. 2, the organic source boat 30 has a separated structure of the first evaporation unit 32 for evaporation of host organic source and the second evaporation unit 34 for evaporation of dopant organic source. Therefore, it is possible to separately heat the host organic source and the dopant organic source and to separately control the deposition rate. And, it is also possible to evaporate in a radial shape around the center of substrate 36.

As a result, according to the organic source boat of FIG. 2, the first and the second deposition units 32,34 are separately formed for deposition of host and dopant organic sources, thereby having improved uniformity of organic source layer, compared with structures in FIGS. 1A to 1C. However, the organic source boat has a circular evaporation structure having the same axis, thereby respectively generating a thick region and a thin region of organic source deposited on the substrate 36. That is, as evaporation processes, evaporated organic source layer becomes thicker in 'A' part close to the center of organic source boat 30 than 'B' part at a long distance thereof, thereby affecting doping concentration of dopant organic source.

SUMMARY OF THE INVENTION

Therefore, the present invention has been made to solve the above problems and an object of the present invention is to provide an organic source boat structure for organic electro-luminescent display fabricating apparatus having improved loading capacity of host/dopant organic source and maintaining uniformity of organic source layer with a point symmetrical structure.

In order to accomplish the above object, the present invention comprises: a plurality of host cells having a plurality of evaporation holes for evaporation of host organic source; a plurality of dopant cells alternatively arranged to the plurality of host cells, having a plurality of evaporation holes for evaporation of dopant organic source; contamination control plates arranged between the host cells and the dopant cells; and a side cover to stably support the host cells and the dopant cells.

According to the present invention, the host cell and the dopant cell are formed in a pie shape wherein the area is increased from the center to the outside and a cylindrical shape is formed by the side cover.

And, the host cell is formed larger than the dopant cell.

It is desirable that evaporation holes of the host cell and the dopant cell are formed with regular distances to the diameter direction and to the arc direction.

And, a cooling water circulatory structure is formed in the contamination control plate.

According to the present invention, the host cell and the dopant cell comprises a cell body for deposition of the host/dopant organic sources, a heater coil rolled around the cell body and a cap having the evaporation hole.

According to the present invention, the host organic source and the dopant organic source are evaporated through evaporation holes formed with regular distances to the diameter direction and to the arc direction from alternatively-arranged a plurality of host cells and dopant cells and then, deposited on the substrate. And, contamination control plates are arranged between the host cells and the dopant cells, thereby preventing bad influence by evaporation of adjacent cells. And, cooling water is circulated in the contamination control plate in order to prevent temperature rise of the plate and therefore, to form uniform organic source layer.

BRIEF DESCRIPTION OF THE DRAWINGS

FIG. 2 is a drawing for showing an organic source boat structure according to still another embodiment of conventional method.

DETAILED DESCRIPTION OF THE INVENTION

The above objects, and other features and advantages of the present invention will become more apparent after reading the following detailed description when taken in conjunction with the appended drawings.

Figure 1A:
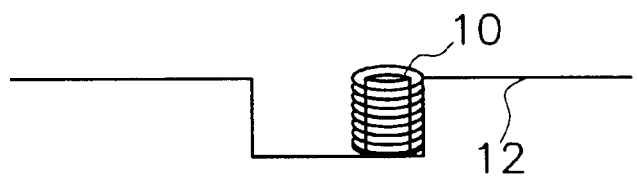
FIG. 1A is a drawing for showing an organic source boat structure according to an embodiment of conventional method.
Figure 1B:
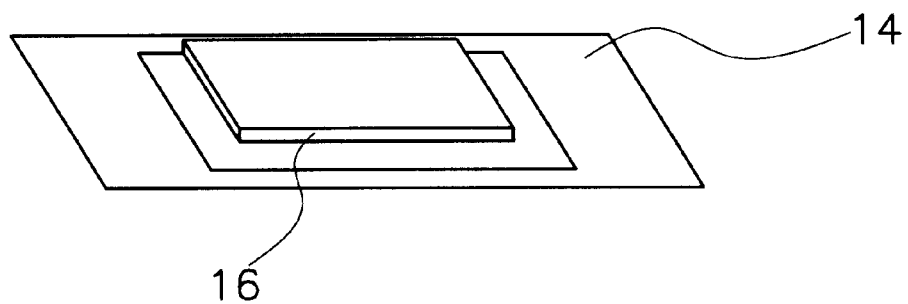
FIG. 1B is a drawing for showing an organic source boat structure according to another embodiment of conventional method.
Figure 1C:
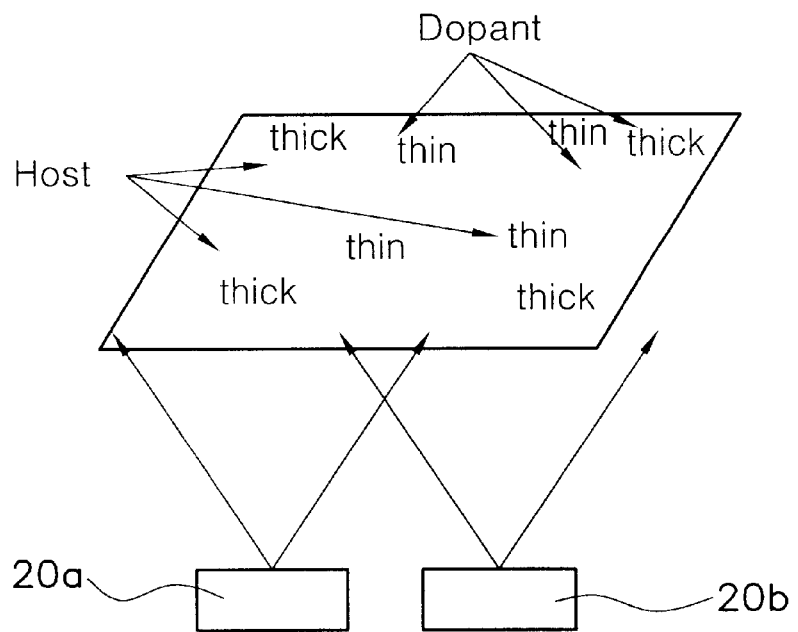
FIG. 1C is a drawing for showing an organic source boat structure according to still another embodiment of conventional method.
Figure 1D:
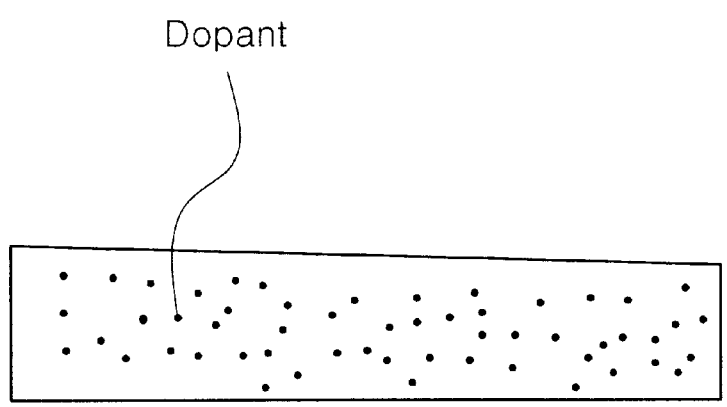
FIG. 1D is a drawing for showing a formation status of organic layer according to the organic source boat structure in FIG. 1C.
Figure 3A:
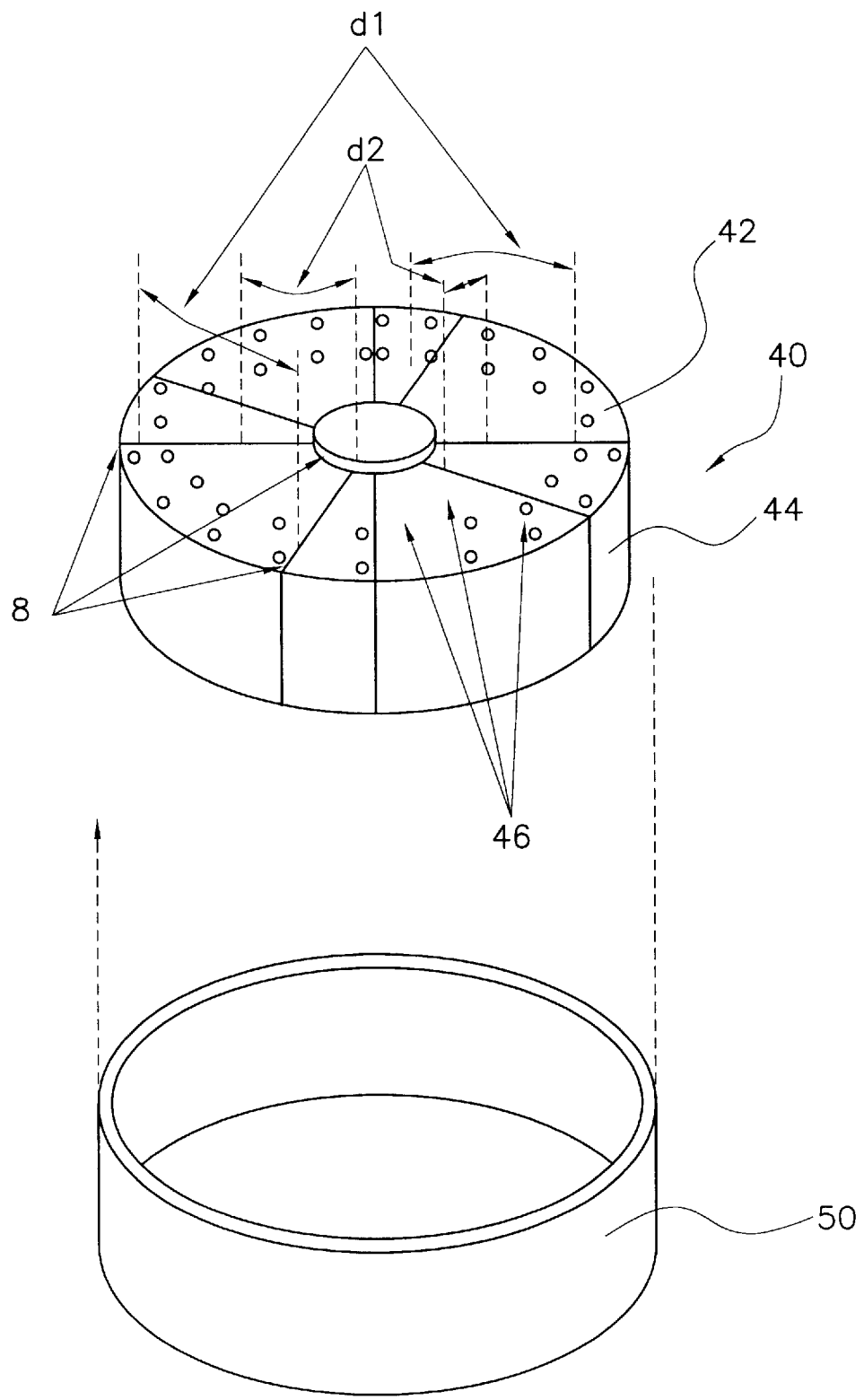
FIGS. 3A and 3B are separated diagram and plane diagram of organic source boat structure for organic electro-luminescent display fabricating apparatus according to a preferred embodiment of the present invention.
Figure 3B:
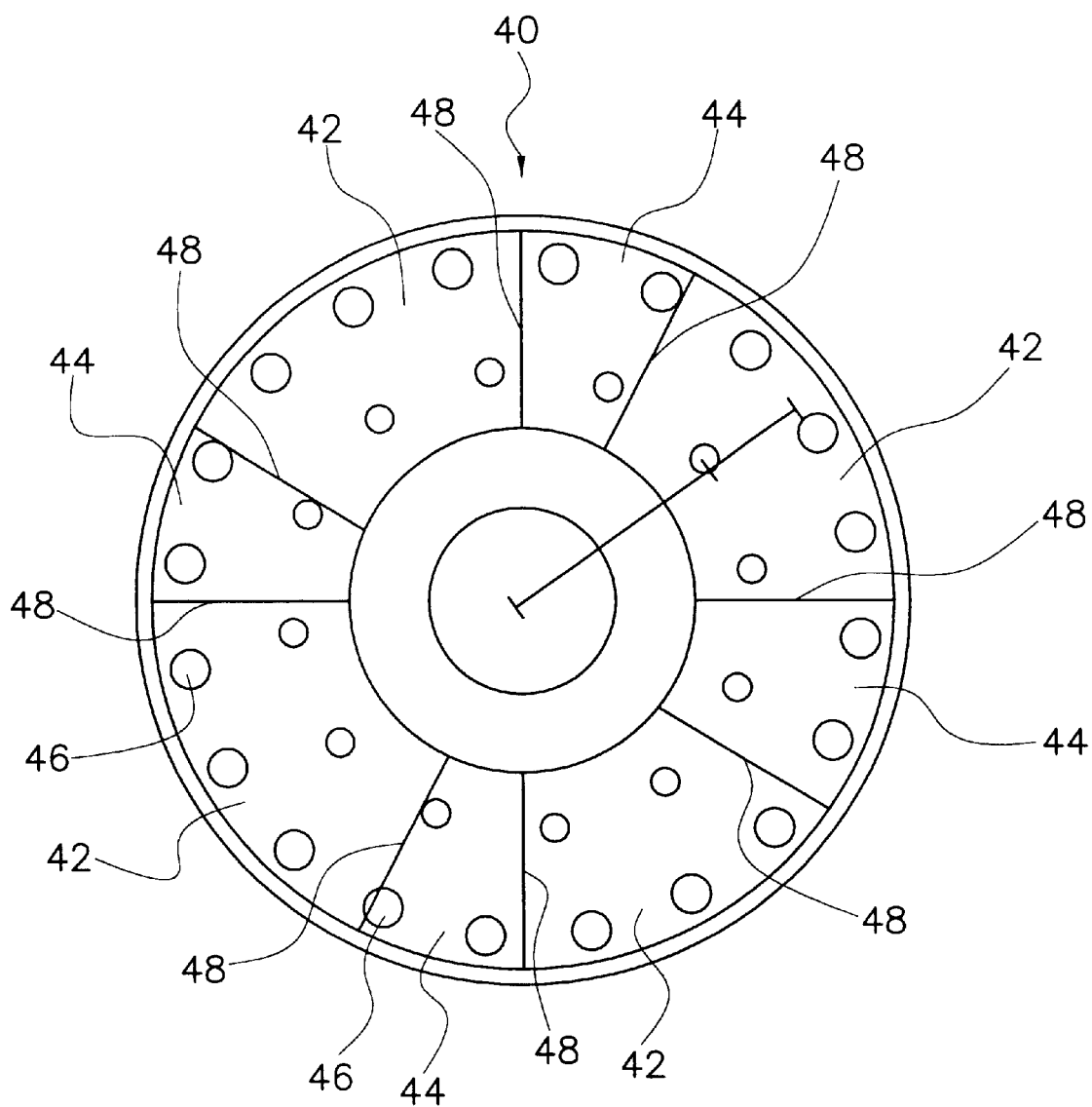
Figure 3C:
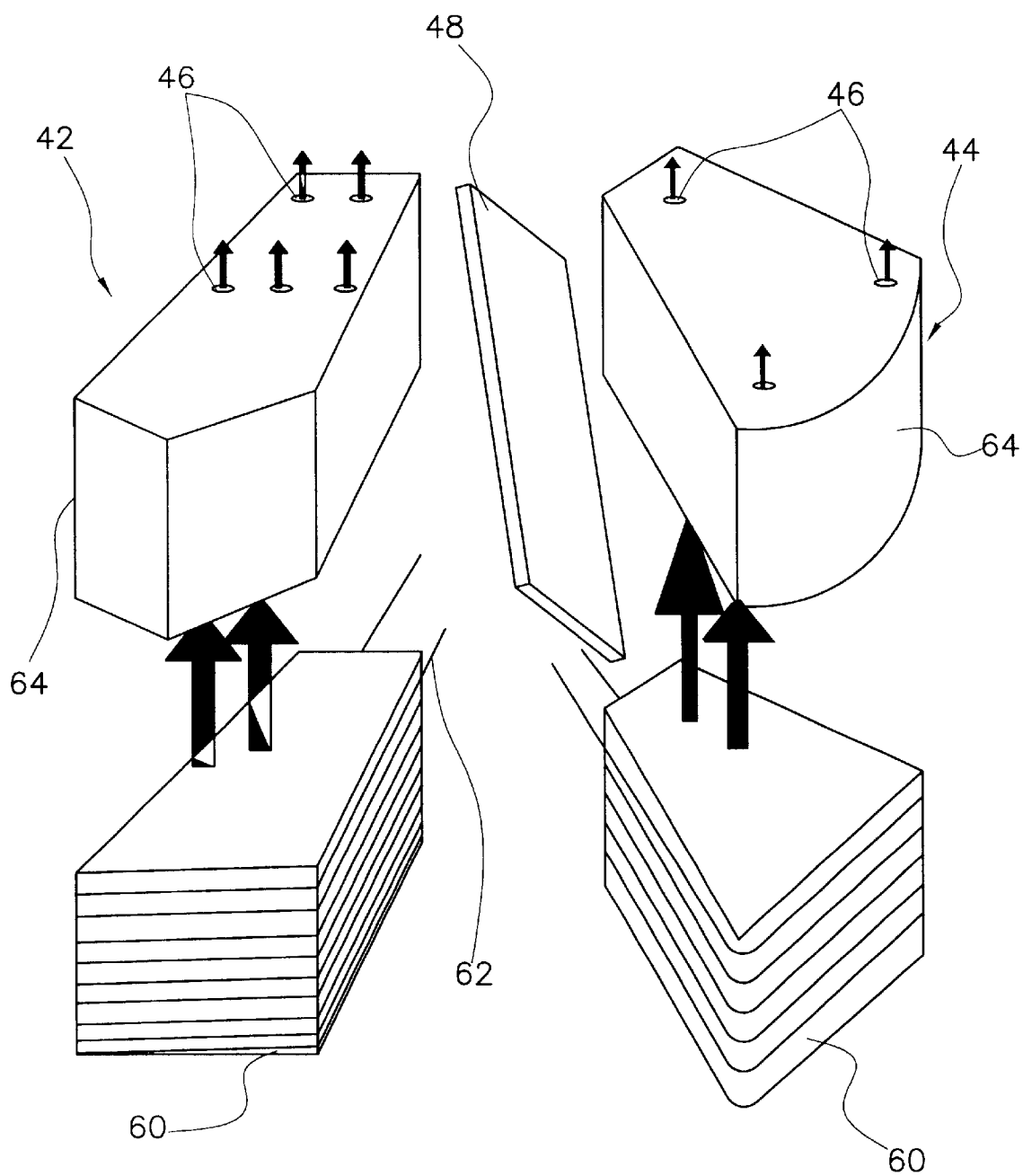
FIG. 3C is a drawing for showing structures of host cell and dopant cell in FIGS. 3A and 3B.

FIG. 3A is a separated diagram of organic source boat structure for organic electro-luminescent display fabricating apparatus and FIG. 3B is a plane diagram thereof and FIG. 3C is a disintegrated diagram of typical cell of host/dopant cells forming an organic source boat according to the present invention.

Referring to the drawings, the present invention has a structure that the organic source boat 40 is point-symmetrically separated in a shape of pie and a plurality of host cells 42 for loading and evaporation of host organic source and a plurality of dopant cells 44 for loading and evaporation of dopant organic source are alternatively arranged.

It is desirable that a plurality of evaporations holes 46 are perforated in the host cell 42 and the dopant cell 44 with regular distances.

And, a contamination control plate 48 is formed between the host cell 42 and the dopant cell 44 in order to prevent contamination thereof and a cooling water circulatory structure is provided in the contamination control plate 48 to prevent temperature rise of corresponding contamination control plate 48 due to heating of adjacent cells.

The host cell 42 has a width d1 larger than the width d2 of the dopant cell 44.

The host cell 42 and the dopant cell 44 are covered by a side cover 50 having a cylindrical shape.

And, the host cell 42 and the dopant cell 44 comprise a cell body 60, for example ceramic crucible, for loading of host/dopant organic sources, a heater coil 62 rolled around the cell body 60 and a cap having evaporation holes 46 perforated with regular distances.

According to the present invention, the host cell 42 and the dopant cell 44 are alternatively arranged, the width being increased from the center to the outside, to control doping uniformity of dopant. Therefore, it is important to alternatively arrange the host cell 42 and the dopant cell 44 in order to improve uniformity of organic layer.

That is, according to the host cell 42 and the dopant cell 44 having a pie structure, it is possible to maintain a regular deposition rate of organic source from the center to the outside.

And, according to the present invention, it is possible to separately heat each cell and control applied power since the host cell 42 and dopant cell 44 has separate heating structures (heating coil 62). Therefore, it is also possible to closely control temperature distribution of the host cell 42 and the dopant cell 44 in order to maintain uniform thickness of deposited organic layer.

The side cover 50 is employed to stably maintain fixation and boat shape of the host cell 42 and the dopant cell 44. And, the contamination control plate 48 is employed to prevent contamination between the host cell 42 and the dopant cell 44 and to prevent temperature rise thereof due to heating of adjacent cells by using cooling water circulatory structure.

And, according to the present invention, several to tens of evaporation holes 46 are formed on the host cell 42 and the dopant cell 44, having a size of approximately several mm so that organic sources are evaporated from the cell and deposited on the substrate through the evaporation hole 46. However, the size is changeable according to conditions.

And, the evaporation holes 46 maintain regular distances to the diameter direction and to the arc direction. However, the distance is also changeable according to conditions.

Figure 4:
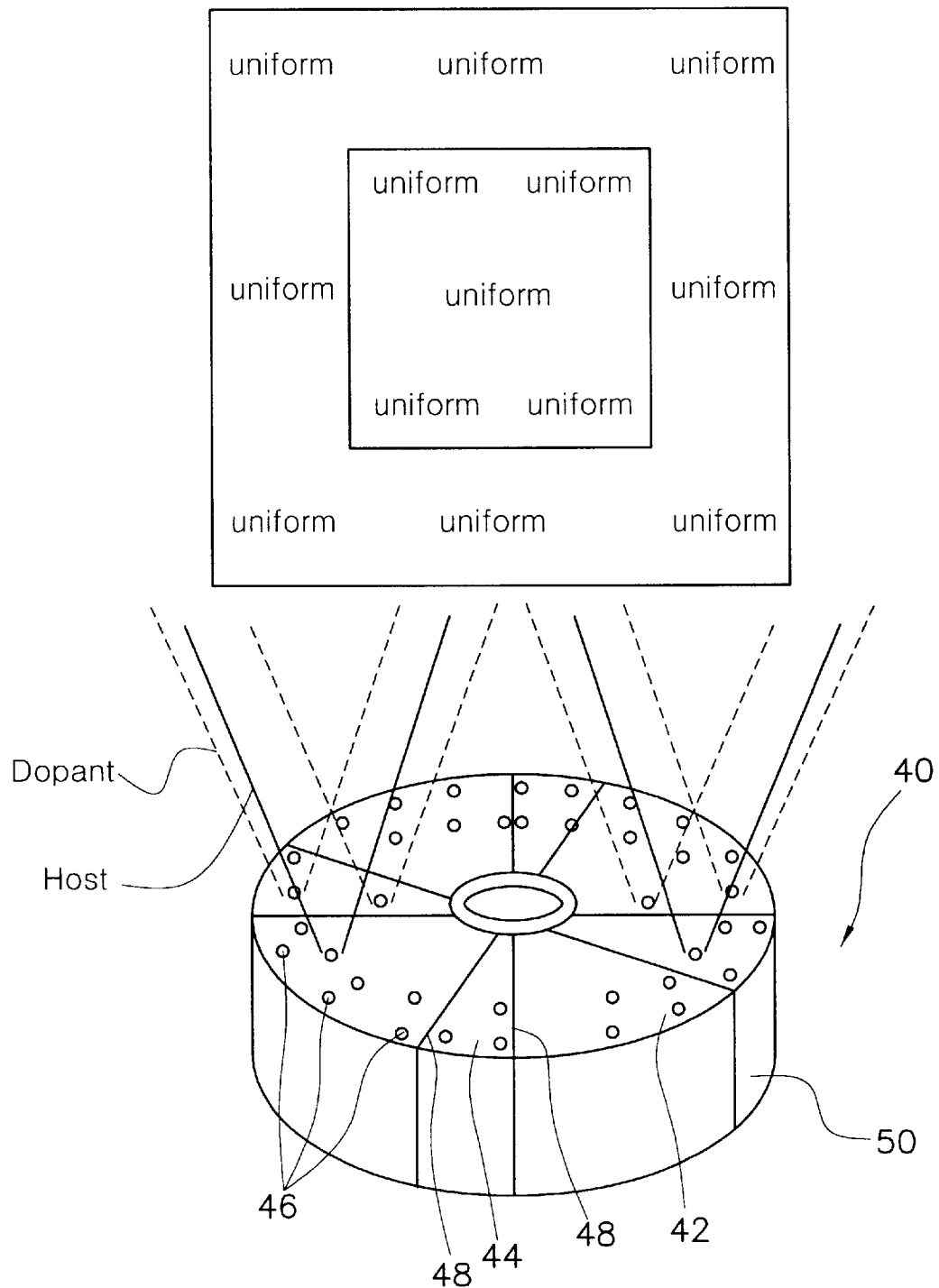
FIG. 4 is a drawing for showing an operation of organic source boat structure for organic electroluminescent display fabricating apparatus according to the present invention.

Referring to FIG. 4, the host organic source and the dopant organic source are alternatively arranged by the structure of host cell 42 and dopant cell 44, thereby improving uniformity of substrate and increasing loading capacity of organic source and therefore, the number of refill is remarkably decreased. As a result, it is appropriate for deposition of organic source in a device for mass production.

And, referring to FIG. 5, there is no great difference of thickness between organic source layer formed on the outside and that on the center by appropriate distribution of evaporation angle and evaporation region.

As described above, according to the present invention, the host organic source and the dopant organic source are alternatively arranged on the substrate for evaporation of organic sources, thereby uniformly controlling thickness of organic layers. And, the host cell and the dopant cell, wherein host organic source and dopant organic source are evaporated through evaporation holes, are separated by contamination control plate. And, cooling water is circulated in the contamination control plate, thereby controlling evaporation temperature of organic source. Therefore, it is possible to form desirable organic layer.

Moreover, the host cell and the dopant cell have maximum loading capacity of host organic source and dopant organic source, thereby decreasing refill times of organic sources. As a result, it is appropriately applied to a device for mass production.

Although the preferred embodiment of this invention has been disclosed for illustrative purpose, those skilled in the art will appreciate that various modifications, alterations, additions and substitutions are possible, without departing from the scope and spirit of the invention.

What is claimed is:

1. An organic source boat structure for organic electroluminescent display fabricating apparatus comprising: a plurality of host cells having a plurality of evaporation holes for evaporation of host organic source; a plurality of dopant cells alternatingly arranged with the plurality of host cells, having a plurality of evaporation holes for evaporation of dopant organic source; a contamination control plate arranged between the host cells and the dopant cells if each pair of alternating host and dopant cells; and a side cover to stably support the host cells and the dopant cells.

2. The organic source boat structure for organic electroluminescent display fabricating apparatus according to claim 1, wherein the host cell and the dopant cell are formed in a wedge shape, having a width increasing from a center toward an outside of the organic source boat structure, and a cylindrical shape is formed by the side cover.

3. The organic source boat structure for organic electroluminescent display fabricating apparatus according to claim 1, wherein the host cell and the dopant cell.

4. The organic source boat structure for organic electroluminescent display fabricating apparatus according to claim 1, wherein the evaporation holes on the host cell and the dopant cell are formed with regular distances in a diameter direction and in an are direction of the organic source boat structure.

5. The organic source boat structure for organic electroluminescent display fabricating apparatus according to claim 1, wherein the contamination control plate has a cooling water circulatory structure therein.

6. The organic source boat structure for organic electroluminescent display fabricating apparatus according to claim 1, wherein each host cell and dopant cell comprises a cell body for evaporation of the host/dopant organic sources, a heater coil arranged around the cell body and a cap having the evaporation holes.

* * * * *